June 2, 1970 MASATOSHI MIGITAKA 3,516,016

VOLTAGE CONTROLLABLE VARIABLE FREQUENCY GUNN OSCILLATOR OF GRADED GaAsP COMPOSITION

Filed May 22, 1968

INVENTOR

MASATOSHI MIGITAKA

BY Craig & Antonelli

ATTORNEYS

United States Patent Office 3,516,016
Patented June 2, 1970

3,516,016
VOLTAGE CONTROLLABLE VARIABLE FREQUENCY GUNN OSCILLATOR OF GRADED GaAsP COMPOSITION

Masatoshi Migitaka, Kodaira-shi, Japan, assignor to Hitachi, Ltd., Tokyo, Japan, a corporation of Japan Filed May 22, 1968, Ser. No. 731,021
Claims priority, application Japan, May 26, 1967, 42/33,121
Int. Cl. H01l 3/00; H03b 7/00
U.S. Cl. 331—107 5 Claims

ABSTRACT OF THE DISCLOSURE

A variable frequency solid-state oscillator comprising a GaAsP semiconductor bulk oscillator in which the ratio of As to P increases continuously, wherein a positive electrode is provided in a part where the P concentration is small and a negative electrode is formed in a part where the P concentration is large. Said oscillator oscillates with a frequency corresponding to the applied voltage when various values of voltage are applied to said device through said electrodes with means for applying excitation voltages.

BACKGROUND OF THE INVENTION

This invention realtes to a so-called Gunn effect solid-state oscillator, wherein a high frequency current oscillation takes place when a high voltage is applied to a high resistivity N type GaAs, InP or the like.

Conventional Gunn effect solid-state oscillators consist of a semiconductor bulk oscillator made of high resistivity N type GaAs, N type InP, etc. and electrodes provided on both sides of said oscillator element in ohmic contact therewith. The oscillation frequency $\nu$ of said oscillator is given by $$\nu = Vd/l$$

where $l$ indicates a distance between said electrode of said oscillator element or a length of said oscillator element and V$d$ indicates a saturated drift velocity of electrons in said oscillator element (it is about $10^7$ cm./sec. at an ordinary temperature).

Thus, the frequency $\nu$ can be changed if the drift velocity is varied. However, since said drift velocity is saturated, the frequency $\nu$ can hardly be changed by changing the applied voltage. Namely, in a solid-state oscillator as described hereinabove, a change in applied voltage of the order of 20% induces or changes in frequency of the order of only 0.2%. Accordingly, it is difficult and, even if feasible, quite inefficient to modulate the frequency electrically in such a device.

In order to obviate said defficiency, a truncated cone or truncated pyramid semiconductor bulk oscillator has been proposed, in which the area of one of the electrodes of the oscillator element is made smaller than that of the other electrode. An oscillator of this structure has a slope in resistivity distribution and if the electric field of a part of the bulk oscillator is designed to exceed a minimum electric field for inducing oscillation or a threshold electric field, an oscillation frequency can be changed by about 50% by changing the external voltage. However, up to now only polishing is known as means to make the bulk oscillator into a truncated cone or truncated pyriamide form. Thus, it has been difficult to reduce the thickness of the bulk to less than a certain value in view of the accuracy of the treatment. Further, in such an oscillator in order to change the frequency effectively it is necessary to make the thickness of the semiconductor bulk greater than the size of the smaller electrode (the width of the electrode). In a common solid-state oscillator, the thickness of the element is made less than 20$\mu$ and the size of the electrode is made to be about $100\mu \times 100\mu$ to enhance the oscillation frequency and to facilitate the dissipation of heat generated in the element. However, in a solid-state oscillator having the structure described hereinabove, the thickness of the element cannot be made very small due to the accuracy of construction and the size of the electrode. Thus, it was not possible to provide a solid-state oscillator oscillating with an ultrahigh-frequency as obtained with a general ultrahigh-frequency solid-state oscillator and operating continuously. Continuous operation becomes more difficult as the thickness of the element increases. Namely, when the thickness of the element is large, the voltage to be applied for oscillation becomes high because the applied voltage is given by a product of the thickness of the element and the threshold electric field of oscillation (nearly constant independent of the element), and the heat generated in the element becomes large. Thus, continuous operation becomes difficult in such a conventional solid-state oscillator.

SUMMARY OF THE INVENTION

A point of this nivention consists in that a crystal, with a composition formula $Ga(As_xP_{1-x})$ wherein $x$ is continuously reduced in an arbitrary range from 1 to 0.5, is used as an oscillator element and that a part of GaAsP where the P concentration is low is used as positive electrode and a part of GaAsP where the P concentration is high is used as negative electrode.

An object of this invention is to provide a variable frequency solid-state oscillator wherein the oscillation frequency thereof can be changed drastically by a small change in applied voltage.

Another object of this invention is to provide a variable frequency solid-state oscillator capable of continuous oscillation.

A further object of this invention is to provide a variable frequency solid-state oscillator which is easy to construct.

DESCRIPTION OF THE PREFERRED EMBODIMENTS

Figure 1:
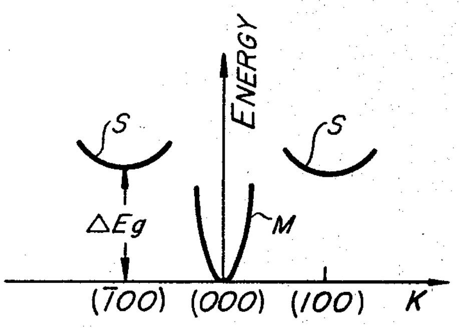
FIG. 1 shows an energy band structure of a conduction band of GaAs presented for the illustration of the principle of this invention.

FIG. 1 is a diagram showing the band structure of GaAs which explains the principle of this invention, wherein the abscissa shows the wave vector $k$ of the electron momentum and the ordinate indicates the energy level of the electron. In the figure, two of the six subbands are shown. As is well-known, the energy difference $\Delta E_g$ between the bottom of the main band M and the bottom of the subband S is 0.36 ev. However, by mixing P into GaAs, it is possible to reduce said energy difference $\Delta E_g$ and to reduce the minimum electric field necessary for oscillation or the threshold electric field $E_c$. Namely, in a crystal with $Ga(As_xP_{1-x})$ wherein $x$ is continuously reduced in an arbitrary range from 1 to 0.5, the energy difference $\Delta E_g$ between the bottom of the main band M and the bottom of the subband S can be reduced continuously in an arbitrary range from 0.36 ev. to 0 ev. and the threshold voltage $E_c$ can be changed by nearly 50%. As is well-known, since Gunn oscillation occurs when the bottom of the main band M has a higher energy than the bottom of the subband S, Gunn oscillation cannot occur when the energy difference $\Delta E_g$ between the bottom of the main band M and the bottom of the subband S is negative or when the value of $x$ is smaller than 0.5.

Accordingly, if a crystal as described hereinabove is prepared and if a part of said crystal where the P concentration is low is connected to a positive electrode part of voltage applying means and a part where the P concentration is high is connected to a negative electrode part, and further if the applied voltage V for oscillation is suitably controlled, the oscillation frequency can be changed in accordance with the change of said applied voltage V, because only the region in the vicinity of the negative electrode having a threshold electric field $E_c$ lower than the electric field induced by the applied voltage contributes to oscillation and causes oscillation of a high frequency when the applied voltage V is low and as the applied voltage V becomes higher (the electric field applied to the element increases), the region contributing to oscillation becomes wider and the oscillation frequency becomes lower.

Figure 2:
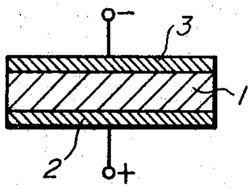
FIG. 2 is a longitudinal sectional diagram of an embodiment of this invention.

FIG. 2 is a longitudinal sectional diagram of an embodiment of this invention wherein 1 indicates a semiconductor bulk oscillator with a composition formula $Ga(As_xP_{1-x})$ wherein $x$ is continuously reduced from 1 to 0.5, 2 indicates a positive electrode provided to the side of the low P concentration region in said bulk in ohmic contact therewith and 3 designates a negative electrode provided to the side of the high P concentration region in said bulk in ohmic contact therewith.

Now, a method of making a solid-state oscillator having the structure described hereinabove will be explained hereinbelow with reference to FIG. 3.

Figures 3, 4, 5:
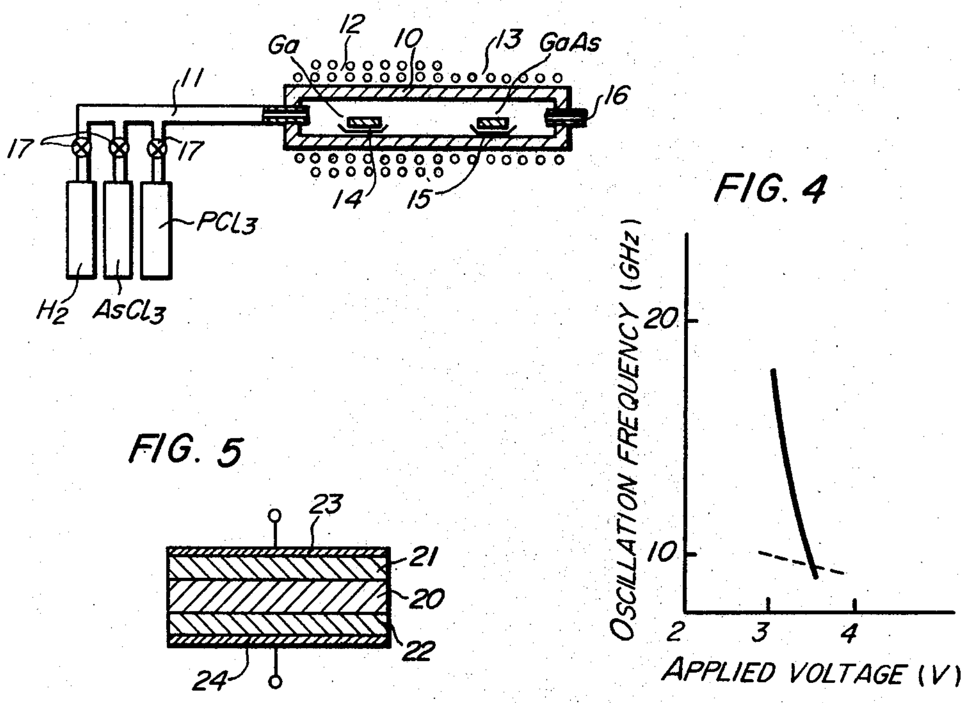
FIG. 3 is a schematic diagram of a device for making a semiconductor bulk oscillator according to this invention.
FIG. 4 is a diagram showing the change of the oscillation frequency in regard to the applied voltage in a conventional solid-state oscillator and in a solid-state oscillator according to this invention.
FIG. 5 is a longitudinal sectional diagram of another embodiment of this invention.

FIG. 3 is a schematic diagram of a device for making a semiconductor bulk oscillator to be used in this invention, wherein 10 indicates a crystal growth furnace comprising a high temperature zone for forming gas of a crystal to be deposited on a substrate and a low temperature zone for depositing said gas of crystal onto the substrate, 11 indicates a pipe for sending a mixture gas of $H_2$ and at least one of $AsCl_3$ and $PCl_3$ into said furnace 10, 12 and 13 designate heater coils for making temperature zones in said furnace 10, 14 and 15 designate boats for placing Ga and GaAs, respectively, 16 indicates an outlet for said gas and 17 indicates valves for adjusting the flow rate of $H_2$, $AsCl_3$ and $PCl_3$.

First, an N type GaAs substrate of 0.01 Ω-cm. in resistivity subjected to etching with a mixed solution of Br and alcohol after mirror polishing is provided in the boat 15 and Ga metal is placed in the boat 14. Then, $H_2$ gas is made to flow into the crystal growth furnace 10 to make the inside thereof full of non-oxidizing atmosphere. Then, an electric current is applied to the heater coils 12, 13 and controlled to make the temperature of said Ga metal and said GaAs 850° C. and 800° C., respectively. Said temperature control is performed to vaporize Ga, to make said Ga vapor react sufficiently well with $AsCl_3$ and $PCl_3$ to deposit on GaAs and to deposit said vapor on GaAs in solid form. After said treatments are preformed, $AsCl_3$ gas and $PCl_3$ gas are sent with $H_2$ gas to the crystal growth furnace 10 by suitably controlling the flow rate thereof with the valves 17 to grow $Ga(As_xP_{1-x})$ from vapor phase on the mirror polished surface of the GaAs 15. In this case, the flow rate of said $AsCl_3$ gas and $PCl_3$ gas is made 1 to 0 at the beginning of the crystal growth and the rate is continuously changed to make said rate 0.5 to 0.5 at the end of the crystal growth, but it is preferable to make the flux constant about 100 cc./min. In other words, the flux of $AsCl_3$ gas is reduced and the flux of $PCl_3$ gas is increased in accordance with the crystal growth so that the flux of $AsCl_3$ gas and $PCl_3$ gas may become 100 cc./min. and 0 cc./min., respectively, at the beginning of the crystal growth and that the flux of $AsCl_3$ gas and that of $PCl_3$ gas may both become 50 cc./min. at the end of the crystal growth. When said treatment is performed for two hours, that is when the flux of $AsCl_3$ gas is reduced by 0.25 cc./hour and the flux of $PCl_3$ is increased by 0.25 cc./hour, a $Ga(As_xP_{1-x})$ crystal having an electron density of about $10^{15}$ cm.$^{-3}$ and a thickness of 10μ, wherein $x$ continuously decreases from 1 to 0.5 is obtained. Then, Sn saturated with GaAs by solution growth technique is provided on the crystal obtained in a way described hereinabove, and Ni is provided on said GaAs substrate and said Sn by electroless plating. Then, the crystal is cut into units each having a size of about 100μ×100μ to provide semiconductor bulk oscillators. When a voltage is applied to such an oscillator in a way to make said Sn side negative and said GaAs side positive, that is in a way to make a part where $x$ in a $Ga(As_xP_{1-x})$ crystal is 0.5 (that is GaAsP wherein the ratio of As to P is 1 to 1) negative and to make a part where $x$ is 1 (that is GaAs) positive after a heat sink is provided to said Sn side and the oscillator is installed into a high-frequency circuit, said oscillator oscillates with a frequency of 18 gHz. and 9 gHz., respectively, when a voltage of 3 v. and 3.5 v. is applied and further the oscillation frequency changes according to the change of said applied voltage.

FIG. 4 shows the state the oscillation frequency changes, wherein the ordinate indicates the oscillation frequency and the abscissa indicates the applied voltage. The curve shown by dotted lines in the figure indicates the change of oscillation frequency obtained with a conventional oscillator. As is apparent from the figure, the change of the oscillation frequency in regard to the change of the applied voltage is remarkably expanded in an oscillator according to this invention compared with a conventional device. The response time of this modulation is less than 1 ns. and quite fast. Further, said oscillator undergoes a continuous wave oscillation of 20 mw. in output and 3% in efficiency when a voltage of 3.5 v. is applied.

Though a variable frequency solid-state oscillator wherein all the regions of the bulk oscillator consist of $Ga(As_xP_{1-x})$ has been described hereinabove, this invention can be applied equally well to an oscillator wherein a part of the bulk oscillator regions is formed of $Ga(As_xP_{1-x})$.

FIG. 5 shows a longitudinal sectional diagram of a variable frequency solid-state oscillator wherein a part of the semiconductor bulk oscillator is formed of $Ga(As_xP_{1-x})$. In the figure, 20 indicates a $Ga(As_xP_{1-x})$ crystal of 10μ in thickness grown on GaAs 22 by the method described hereinabove, 21 indicates a GaAsP crystals of 3μ in thickness grown on said $Ga(As_xP_{1-x})$ crystal, 23 is a negative electrode provided on the GaAsP crystal 21, and 24 is a positive electrode provided on said GaAs crystal 22. Said oscillator is used by connecting the device to excitation voltage applying means which applies an electric field sufficient for the oscillation of the bulk oscillator to said bulk oscillator.

A solid-state oscillator of such a structure oscillates with a frequency of 30 gHz., 15 gHz. and 8 gHz., respectively, when the applied voltage is 3 v., 3.5 v. and 5 v. Moreover, the oscillation frequency changes continuously with the continuous change of said applied voltage.

Though a case where a crystal of a composition formula $Ga(As_xP_{1-x})$ wherein $x$ continuously decreases from 1 to 0.5 is used as a semiconductor bulk oscillator has been described in the above explanation of the two embodiments of this invention, it will be evident from the foregoing description of the principle of this invention that this invention can also be achieved by employing a crystal of a composition formula $Ga(As_xP_{1-x})$ wherein $x$ continuously decreases in an arbitrary intermediate portion of its range of from 1 to 0.5.

I claim:

1. A variable frequency solid-waste oscillator comprising a semiconductor bulk oscillator consisting of a crystal of a composition formula $Ga(As_xP_{1-x})$ wherein $x$ continuously decreases in an arbitrary range between the values 1 and 0.5; a positive electrode provided to a part of said semiconductor bulk oscillator where the P concentration is low; a negative electrode provided to a part of said semiconductor bulk oscillator where the P concentration is high; and means for applying an excitation voltage which is connected to said positive and negative electrodes and which applies an electric field sufficient for the oscillation of said semiconductor bulk oscillator to said bulk oscillator.

2. A variable frequency solid-state oscillator comprising a semiconductor bulk oscillator partially including a crystal of a composition formula $Ga(As_xP_{1-x})$ wherein $x$ continuously decreases in an arbitrary range between the values 1 and 0.5; a positive electrode provided to a part of said semiconductor bulk oscillator where the P concentration is low; a negative electrode provided to a part of said semiconductor bulk oscillator where the P concentration is high; and means for applying an excitation voltage which is connected to said positive and negative electrodes and which applies an electric field sufficient for the oscillation of said semiconductor bulk oscillator to said bulk oscillator.

3. A variable frequency solid-state oscillator as defined in claim 2, wherein a crystal of GaAs is disposed between said positive electrode and said $Ga(As_xP_{1-x})$ crystal, and a crystal of GaAsP is disposed between said negative electrode and said $Ga(As_xP_{1-x})$ crystal.

4. A variable frequency solid-state oscillator as defined in claim 1, wherein $x$ continuously decreases from 1 to 0.5.

5. A variable frequency solid-state oscillator as defined in claim 2, wherein $x$ continuously decreases from 1 to 0.5.

References Cited

UNITED STATES PATENTS 3,377,566 4/1968 Lanza.

OTHER REFERENCES

Allen et al., "Microwave Oscillations in $GaAs_xP_{1-x}$ Alloys," Applied Physics Letters, Aug. 15, 1965, pp. 78–80.

ROY LAKE, Primary Examiner

S. H. GRIMM, Assistant Examiner

U.S. Cl. X.R.

317—234